(12) United States Patent
Shibuya et al.

(10) Patent No.: US 12,040,260 B2
(45) Date of Patent: Jul. 16, 2024

(54) ELECTRONIC PACKAGE WITH SURFACE CONTACT WIRE EXTENSIONS

(71) Applicant: TEXAS INSTRUMENTS INCORPORATED, Dallas, TX (US)

(72) Inventors: Makoto Shibuya, Beppu (JP); Ayumu Kuroda, Beppu (JP); Kengo Aoya, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 574 days.

(21) Appl. No.: 17/139,987

(22) Filed: Dec. 31, 2020

(65) Prior Publication Data

US 2022/0208660 A1    Jun. 30, 2022

(51) Int. Cl.
*H01L 23/495*  (2006.01)
*H01L 21/56*  (2006.01)
*H01L 23/00*  (2006.01)
*H01L 23/31*  (2006.01)

(52) U.S. Cl.
CPC ...... *H01L 23/49555* (2013.01); *H01L 21/561* (2013.01); *H01L 23/3107* (2013.01); *H01L 23/4952* (2013.01); *H01L 23/49582* (2013.01); *H01L 24/48* (2013.01); *H01L 24/85* (2013.01); *H01L 2224/48245* (2013.01); *H01L 2224/85205* (2013.01)

(58) Field of Classification Search
CPC ........... H01L 23/49555; H01L 23/3107; H01L 23/4952; H01L 23/49582; H01L 24/48; H01L 24/85; H01L 24/49; H01L 24/97; H01L 24/45; H01L 21/561
See application file for complete search history.

(56) References Cited

U.S. PATENT DOCUMENTS

| | | |
|---|---|---|
| 7,115,446 B2 | 10/2006 | Koo et al. |
| 7,245,023 B1 | 7/2007 | Lin |
| 8,216,885 B2 | 7/2012 | Holloway |
| 8,492,906 B2 | 7/2013 | Nondhasitthichai et al. |
| 9,373,569 B1 | 6/2016 | Javier et al. |
| 9,627,299 B1 * | 4/2017 | Flessner ............ H01L 23/49568 |
| 9,768,137 B2 | 9/2017 | Chen et al. |
| 9,966,326 B2 | 5/2018 | Mustanir et al. |
| 2019/0081012 A1 * | 3/2019 | Wu ..................... H01L 23/3107 |
| 2019/0378783 A1 | 12/2019 | Castro et al. |
| 2020/0286816 A1 | 9/2020 | Komatsu et al. |

* cited by examiner

*Primary Examiner* — Marc Anthony Armand
(74) *Attorney, Agent, or Firm* — Dawn Jos; Frank D. Cimino

(57) ABSTRACT

An electronic package includes an electronic component including terminals, a plurality of surface contacts, at least some of the surface contacts being electrically coupled to the terminals within the electronic package, a mold compound covering the electronic component and partially covering the surface contacts with a bottom surface exposed from the mold compound, and a plurality of wires extending from exposed surfaces of the surface contacts, each of the wires providing a solderable surface for mounting the electronic package at a standoff on an external board.

17 Claims, 9 Drawing Sheets

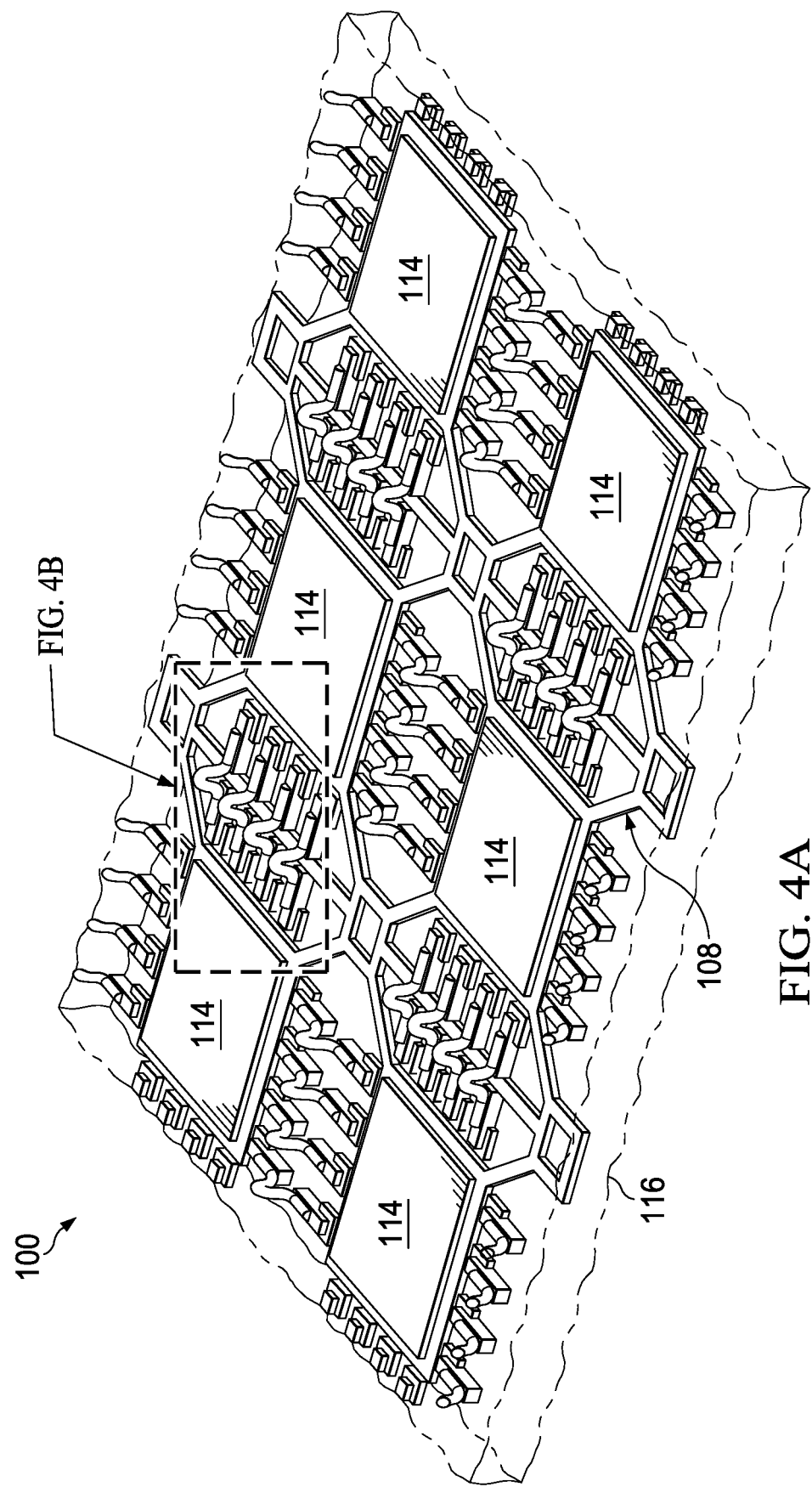

ELECTRONIC PACKAGE WITH SURFACE CONTACT WIRE EXTENSIONS

TECHNICAL FIELD

This disclosure relates to electronic packages, and more particularly, to electronic packages with surface contacts.

BACKGROUND

Component packaging is often driven by the consumer electronics market with less consideration given to higher reliability industries such as automotive, medical, industrial, and aviation. Improved packaging technologies and component miniaturization can often lead to new or unexpected design, manufacturing, and reliability issues. This has been the case with non-leaded devices, for example, Quad-Flat No-leads (QFN) and Small-Outline No-leads (SON), also referred to as Dual-Flat No-leads (DFN), devices, especially when it comes to adoption by new non-consumer electronic original equipment manufacturers. Integration of component device families, such as QFN/SON, into high reliability environments can be difficult. QFN/SON components are known to be susceptible to solder fatigue issues, especially thereto-mechanical fatigue due to thermal cycling. The lower standoff in QFN/SON devices can lead to higher thermo-mechanical strains due to coefficient of thermal expansion (CTE) mismatch as compared to leaded devices.

There are also issues on the manufacturing side. For larger QFN/SON components, moisture absorption during solder reflow can be a concern. If there is a large amount of moisture absorption into the device then heating during reflow can lead to excessive component warpage. This can cause the corners of the component lifting off the printed circuit board causing improper joint formation. Several other issues with manufacturing include: part floating due to excessive solder paste under the center thermal pad, large solder voiding, poor rework able characteristics, and optimizing the solder reflow profile. However, one of the most significant issues preventing widespread adoption of QFN/SON devices into high reliability environments is the inability of automated solder joint inspection equipment to adequately inspect the solder joints of QFN/SON devices, which have no contact through-holes and/or external leads extending outward from the QFN/SON devices. Manufacturers who integrate QFN/SON devices onto printed wiring boards (PWBs) cannot adequately inspect the solder joints between the QFN/SON devices and the PWBs. In contrast, leaded devices can be inspected because the leads extend outward and away from the leaded device and the corresponding solder joints each form a solder fillet, which is visible.

As mentioned previously, QFN/SON are widely used in the consumer electronics market. Unlike for leaded devices, in QFN/SON, the electrical contacts or terminals are inset into the mold cap as surface contacts. Nothing extends from the device in order to surface mount, as shown in FIG. 1. This feature of the non-leaded packages, including QFN/SON, allows them to be small, on the order chip-scale.

A QFN device begins with a lead frame having a die attach pad 14, which may also serve as a thermal pad, and surface contacts 12, as shown in FIG. 2. In at least one example the lead frame is constructed of copper material, 200 µm (or 8 mils) thick and the width of each surface contact lead is 200 mm. Next, a semiconductor die 18 is attached, via die attach material 22, to a top surface of die attach pad 14. Next, wire bonds 20 are formed between the lead frame leads and the bond pads or terminals of semiconductor die 18, electrically coupling the bond pads of semiconductor die 18 to associated surface contacts 12. Gold, copper, or palladium coated wire (PCC) are examples of wire that may be used for wire bonds 20. PCC wire is low cost and has a noble finish, mitigating oxidation oxidize but bonding wire having other composition and size can also be used.

Finally, the resulting combination of semiconductor die 18, die support pad 14, and wire bonds 20 are covered with a mold compound 16. Typically, plastic is used as the mold compound, but use of other materials, including ceramics, can also be used. As shown in FIG. 3, with a typical QFN fabrication process, there are multiple QFN devices 10 on a strip assembly 36 that are block molded/encapsulated at the same time. QFN devices 10 are thereafter singulated to produce individual QFN devices, as shown in FIGS. 1 and 2. A flat surface at the bottom of the QFN device is the only contact surface for mounting to a printed wiring board.

Surface contacts 12 and die attach/thermal pad 14 are partially covered by mold compound 16 with exposed surfaces being coplanar with bottom and side surfaces of mold compound 16. The exposed surface of the die attach/thermal pad 14 can be soldered to a corresponding pad on a PWB or attached with other heat conductive die attach material. Surface contacts 12 of QFN device 10 can be soldered to corresponding electrical contacts or terminals, on a PWB. FIGS. 1-3 show that a first portion of each of surface contacts 12 are exposed on a bottom surface of QFN device 10 and an end portion of each of surface contacts 12 are exposed on a side surface of QFN device 10. The side surfaces of the electrical contacts or terminals are typically exposed during a singulation process during which a saw is used to cut each QFN device 10 from strip assembly 36 which cuts through an end portion of each of surface contacts 12 and exposes the resulting side surfaces. The result is that bottom and side surfaces of surface contacts 12 are exposed in a coplanar arrangement with bottom and side surfaces of mold compound 16.

BRIEF SUMMARY

As disclosed herein, non-leaded packages are modified to include wires extending from bottom surface of their surface contacts. The wires enable inspectable solder joints when attached to a PWB, and offer improved reliability by increasing standoff height and reducing solder fatigue issues compared to standard non-leaded packages, including QFN/SON.

As one example, an electronic package includes an electronic component including terminals, a plurality of surface contacts, at least some of the surface contacts being electrically coupled to the terminals within the electronic package, a mold compound covering the electronic component and partially covering the surface contacts with a bottom surface exposed from the mold compound, and a plurality of wires extending from exposed surfaces of the surface contacts, each of the wires providing a solderable surface for mounting the electronic package at a standoff on an external board.

In another example, a method for fabricating an electronic package includes wire bonding a plurality of wires to exposed bottom surfaces of surface contacts of the electronic package, the electronic package further including an electronic component including terminals and a mold compound covering the electronic component and partially covering the surface contacts. The surface contacts are electrically coupled to the terminals within the electronic package. The method further includes, with the wires attached to the exposed bottom surfaces of the surface contacts, cutting the mold compound to singulate the electronic package from a strip of electronic packages.

BRIEF DESCRIPTION OF THE DRAWINGS

FIGS. 4A and 4B are perspective views of multiple QFN devices on a strip assembly subsequent to block molding and subsequent to placement of wires extending from a bottom surface of the leads of each of the QFN devices, but prior to singulation.

DETAILED DESCRIPTION

Figure 4B:
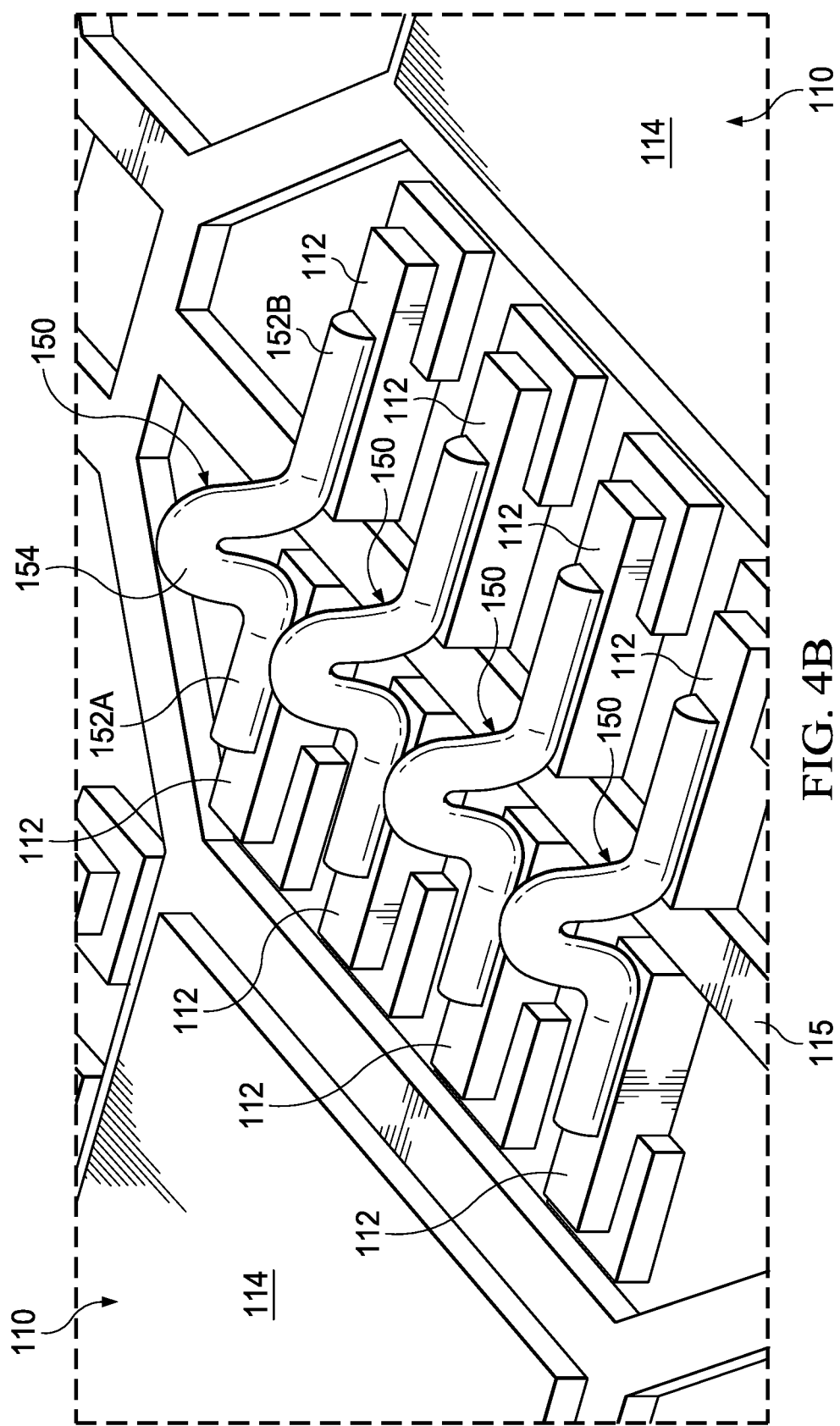
Figure 5:
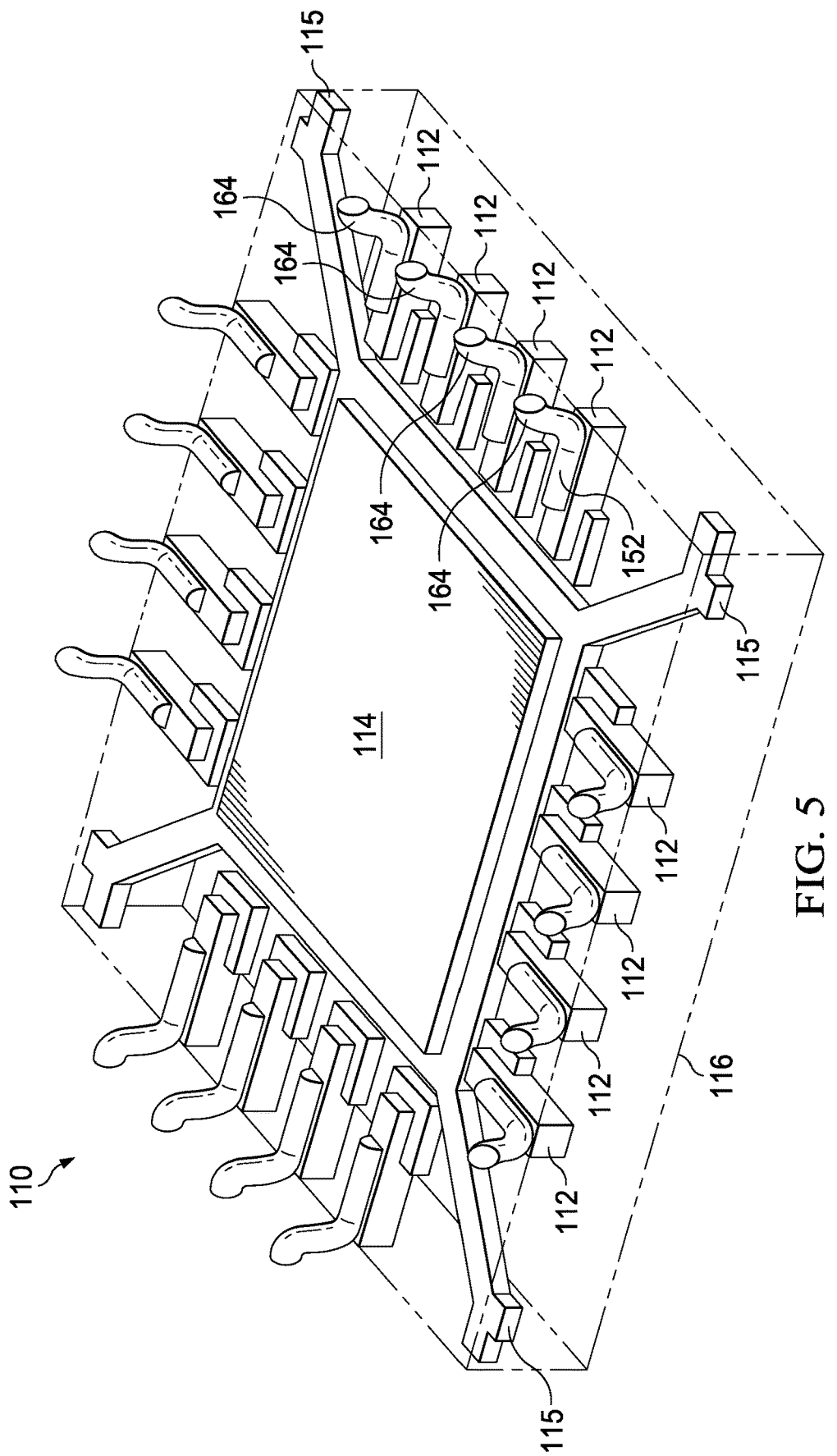
FIG. 5 is a perspective view of a QFN device of the strip assembly of FIGS. 4A and 4B after singulation.

FIGS. 4A, 4B and 5 illustrate example QFN packages 110 including wires 150 extending from bottom surfaces of QFN surface contacts 112. Specifically, FIG. 4A is a perspective view of multiple QFN packages 110 on a strip assembly 100 subsequent to block molding but prior to singulation. FIG. 4B is a close-up perspective view of a portion of strip assembly 100. FIG. 5 is a perspective view of a single package 110 after singulation from strip assembly 100.

Figure 1:
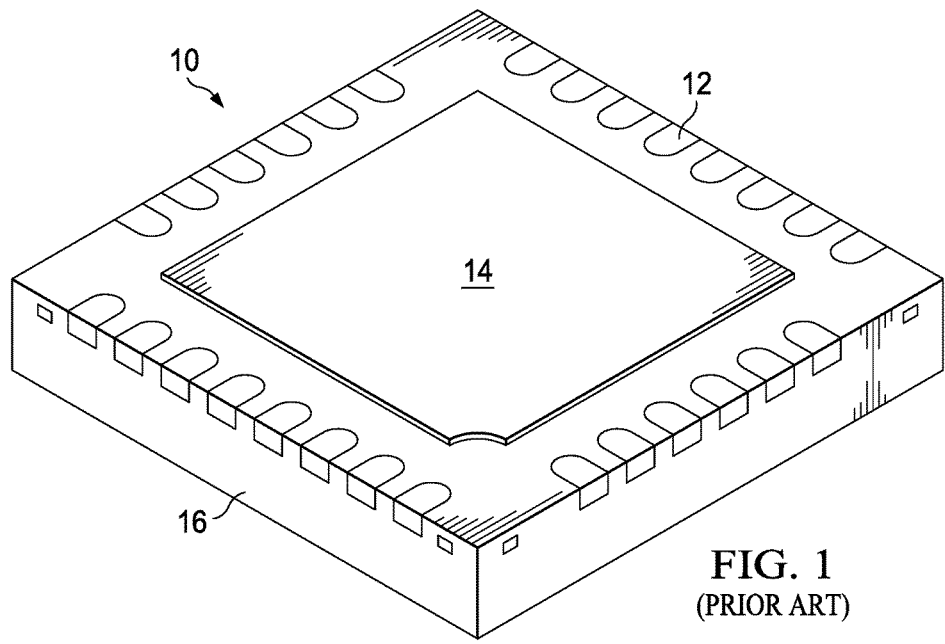
FIG. 1 is a perspective view of a bottom surface of a typical 28-pin, single row, QFN device.
Figure 2:
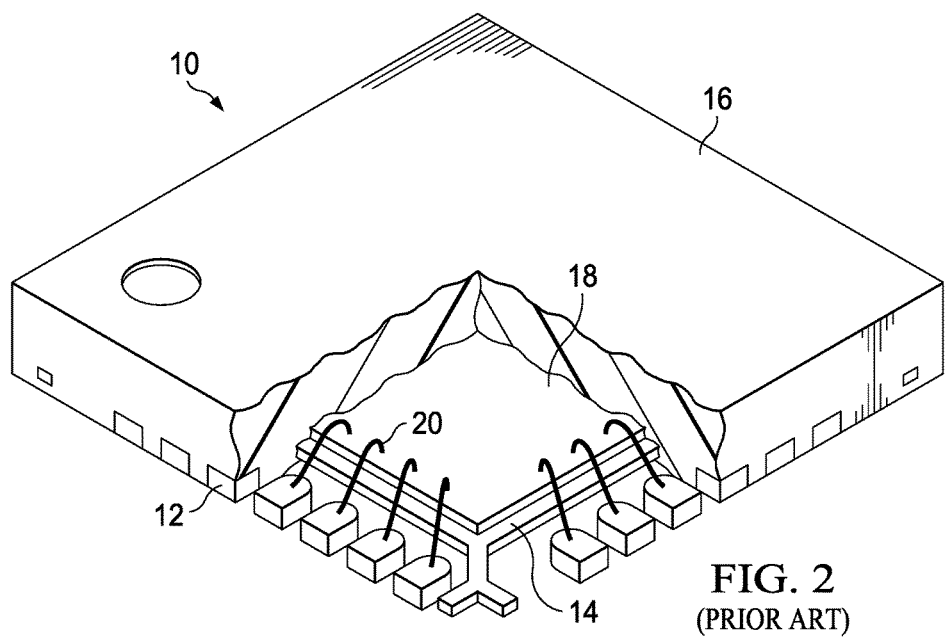
FIG. 2 is a perspective view of a top surface of the QFN device of FIG. 1 with a portion of the device encapsulation material removed.
Figure 3:
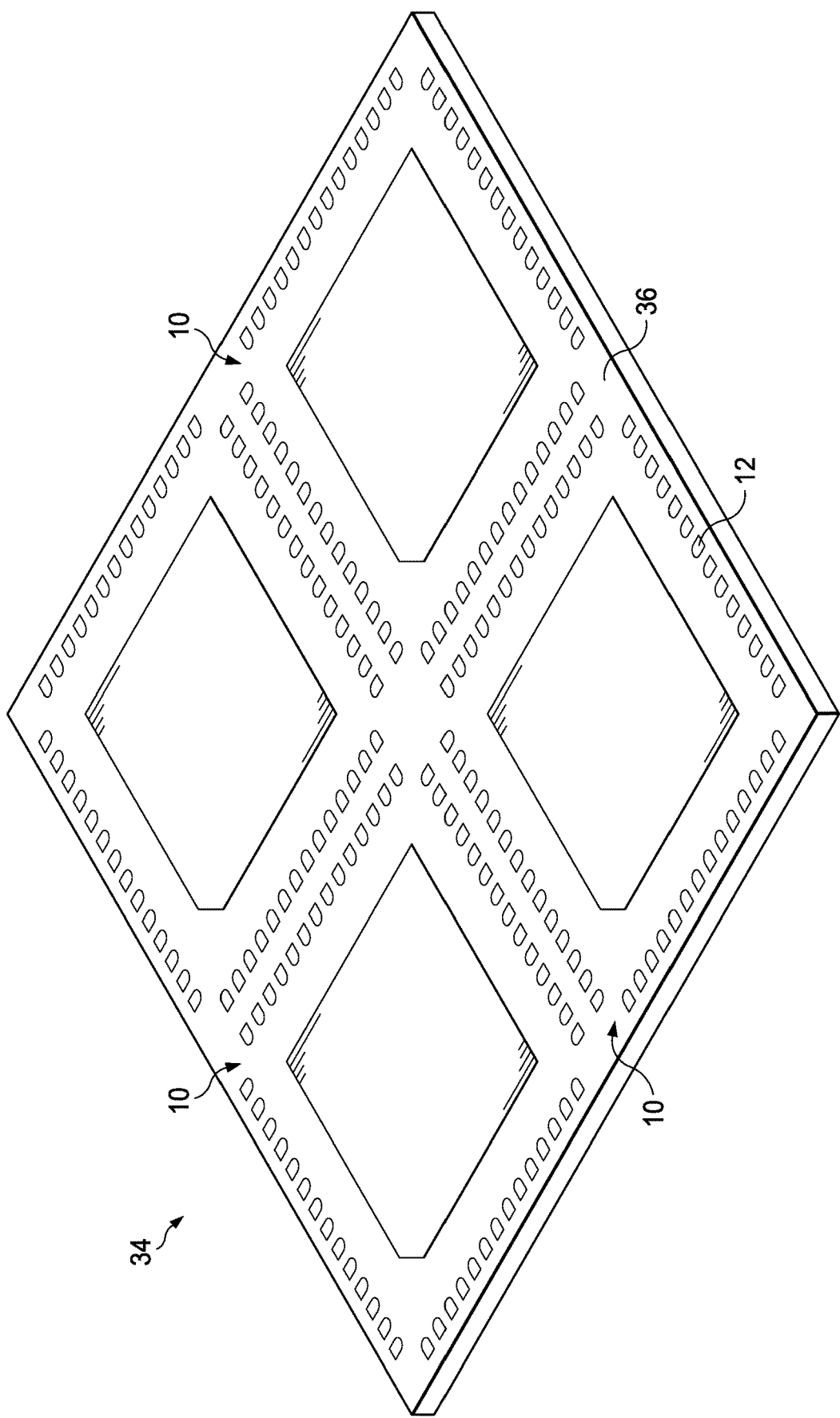
FIG. 3 is a perspective view of multiple QFN devices on a strip assembly subsequent to block molding but prior to singulation.

Each package 110 includes at least one electronic component, such as a semiconductor die. For example, the electronic component may be mounted to pad 114 and covered by mold compound 116. The electronic component is also electrically connected to at least some of the surface contacts 112. For example, each package 110 may be substantially similar to QFN device 10 (FIG. 2) with the addition of wires 150.

Wires 150 extend from the exposed bottom surfaces of some or all of surface contacts 112 beyond a bottom surface of the mold compound 116. Although strip assembly 100 may include wires 150 for each surface contacts 112, some of wires 150 are omitted from FIG. 4A for simplicity. Wires 150 provide a solderable surface for mounting the packages 110 at a standoff on an external board, such as a PWB. While any standoff may be selected according to the requirements of a particular application, in some examples, a standoff within a range of 100 to 600 microns is suitable to facilitate inspectable solder joints and reducing solder fatigue compared to standard QFN devices like QFN device 10.

QFN packages 110 are mold array process (MAP) type non-leaded packages. This means QFN packages 110 are molded in a single cavity mold to form strip assembly 100, and singulation includes cutting through the common mold compound 116 to separate strip assembly 100 into individual QFN packages 110.

Wires 150 may be formed on one or more contacts 112 of QFN packages 110 using a wire bonder, for example. Prior to singulation, each wire 150 is attached on one side with a stitch bond 152A, the wire forms an arch 154, and is attached on the other side with a stich bond 152B to the associated surface contact 112 of the adjacent package 110 (FIG. 4B). Stich bonds 152A, 152B are collectively referred to as stich bonds 152. During singulation, each wire 150 is cut through its arch 154 leaving a distal end 164 (FIG. 5) of each wire 150 free floating. As wires 150 are cut in unison with mold compound 116 during singulation, distal end 164 of each wire 150 is coplanar with a side surface of mold compound 116. In other examples, wires 150 may be shaped, such as bending or grinding after singulations such that the distal ends may not be coplanar with a side surface of mold compound 116. The consistency of the heights, the standoff, of wires 150 is generally uniform such that distal ends 164 are in planar alignment to support surface mounting package 110 by way of solder connections between wires 150 and electrical contacts of a board, such as a PWB.

Heavy gauge aluminum or copper wire may be used for wires 150. While any wire diameter may be selected according to specific requirements of package 110, wires 150 will generally be larger than wires used in wire bonding an electrical component to leads within the package. For example, wires 150 have wire diameters of at least 200 microns, whereas wire bonds providing electrical connections between electronic component terminals and contacts 112, such as wire bonds 20 (FIG. 2) may have much smaller wire diameters, such as diameters less than 100 microns, such as diameters between about 10 to 50 microns.

For copper wire or other metal that would benefit from a plating layer, a tin coating may be applied to QFN packages 110 either as part of strip assembly 100 or after singulation. Such a tin coating also covers portions of surface contacts 112 exposed during the plating process. For example, if plating were applied prior to singulation, bottom surfaces of contacts 112 may include a plating layer, but side surfaces may include copper exposed by the singulation process. Alternatively, a partial cut may be used to exposed side surfaces of surface contacts 112 prior to singulation of strip assembly 100, and both side surfaces and bottom surfaces of contacts 112 may share the same coating as wires 150. Assuming the tin coating was applied after mold compound 116, the tin coating would not cover portions of surface contacts 112 covered by mold compound 116.

Strip assembly 100 includes a leadframe strip 108, which includes a pad 114 and surface contacts 112 for each package 110. Leadframe strip 108 further includes tie bars 115 which interconnect pad 114, contacts 112 and other elements of the leadframes to one another as well as to elements of adjacent leadframes in a leadframe strip. Leadframes on leadframe strip 108 are arranged in rows and columns. A siderail may surround the array of leadframes to provide rigidity and support leadframe elements on the perimeter of the leadframe strip. The siderail may also include alignment features to aid in manufacturing. The siderail and portions of tie bars 115 are removed during singulation.

Leadframe strip 108 predominantly includes copper, such as a copper alloy. As referred to herein, "predominately including" means greater than fifty percent by weight, up to one hundred percent by weight. Examples of suitable copper alloys for leadframe strip 108 include aluminum bronze (copper ninety-two percent by weight, aluminum eight percent by weight), beryllium copper (copper ninety-eight percent by weight, beryllium two percent by weight), cartridge brass (copper seventy percent by weight, zinc thirty percent by weight), cupronickel (copper seventy percent by weight, nickel thirty percent by weight), gunmetal (copper ninety percent by weight, tin ten percent by weight), nickel silver (copper seventy-eight percent by weight, nickel twelve percent by weight, lead ten percent by weight), as well as copper alloys C19210, C19400, and C70250 under the unified numbering system. In other examples, leadframe strip 108 may predominantly include iron-nickel alloys (for instance the so-called "Alloy 42"), or aluminum.

Leadframe strip 108 is formed on a single thin (about 120 to 250 μm) sheet of metal by stamping or etching. The ductility in this thickness range provides the 5 to 15% elongation that facilitates an intended bending and forming operation. The configuration or structure of the leadframe is stamped or etched from the starting metal sheet.

Mold compound 116 provides a protective outer layer for the electronic component and electrical connections to contacts 112 in each package 110. Portions of contacts 112 and pad 114 are exposed an outer surface of each package 110. In some examples, mold compound 116 includes an epoxy such as an epoxy-based thermoset polymer.

Usually die mounting, die to electrical contact attachment, such as wire bonding, and molding to cover at least part of the leadframe and dies take place while the leadframes are still integrally connected as a leadframe strip. After such processes are completed, the leadframes, and mold compound of a package, are severed ("singulated" or "diced") with a cutting tool, such as a saw or laser. These singulation cuts separate the leadframe strip into separate packages, each semiconductor package including a singulated leadframe, at least one electronic component, electrical connections between the electronic component and leads (such as gold or copper wire bonds) and the mold compound which covers at least part of these structures.

Figure 6A:
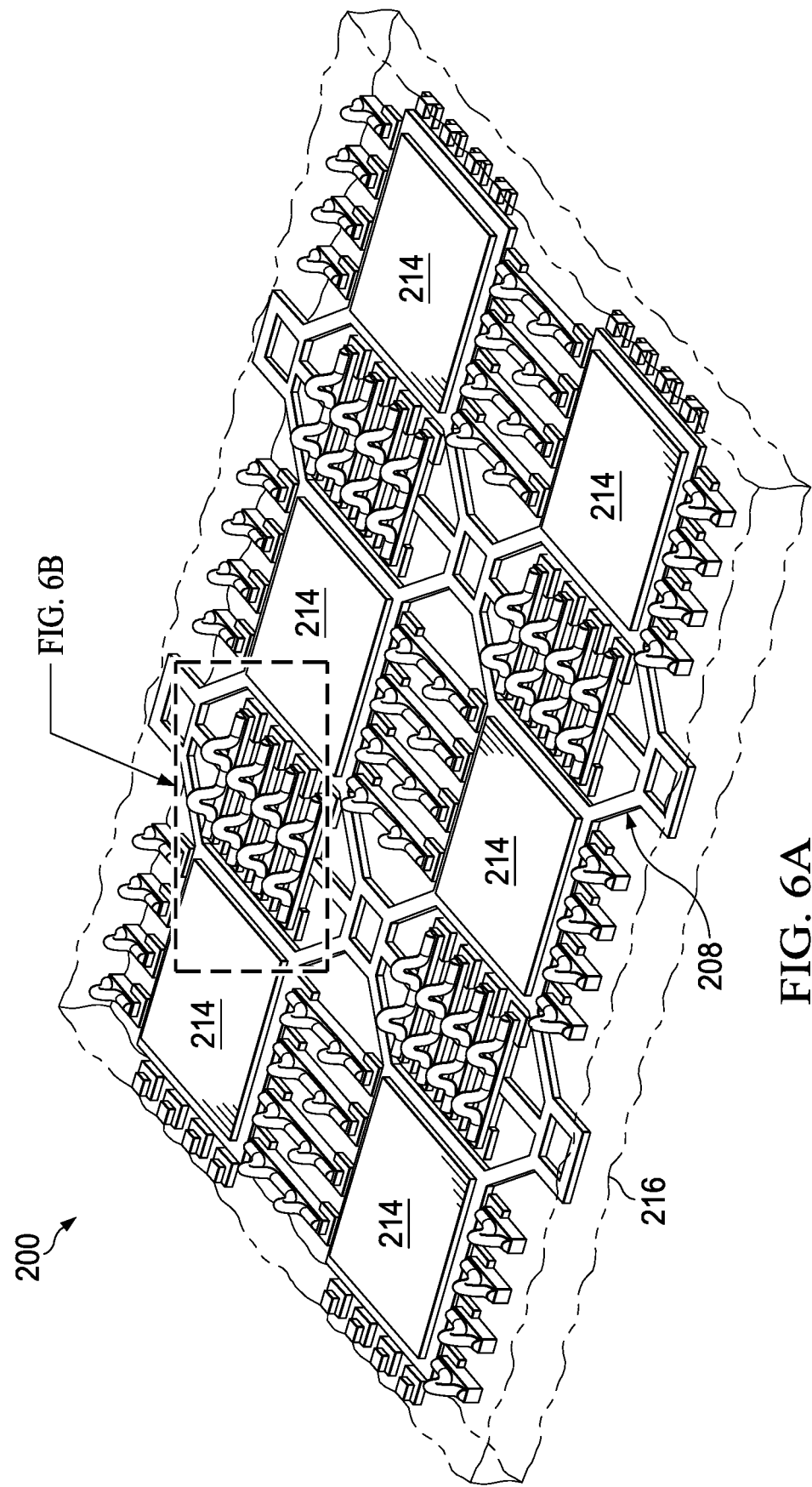
FIGS. 6A and 6B are perspective views of multiple QFN devices on a strip assembly subsequent to block molding and subsequent to placement of wires extending from a bottom surface of the leads of each of the QFN devices, but prior to singulation.
Figure 6B:
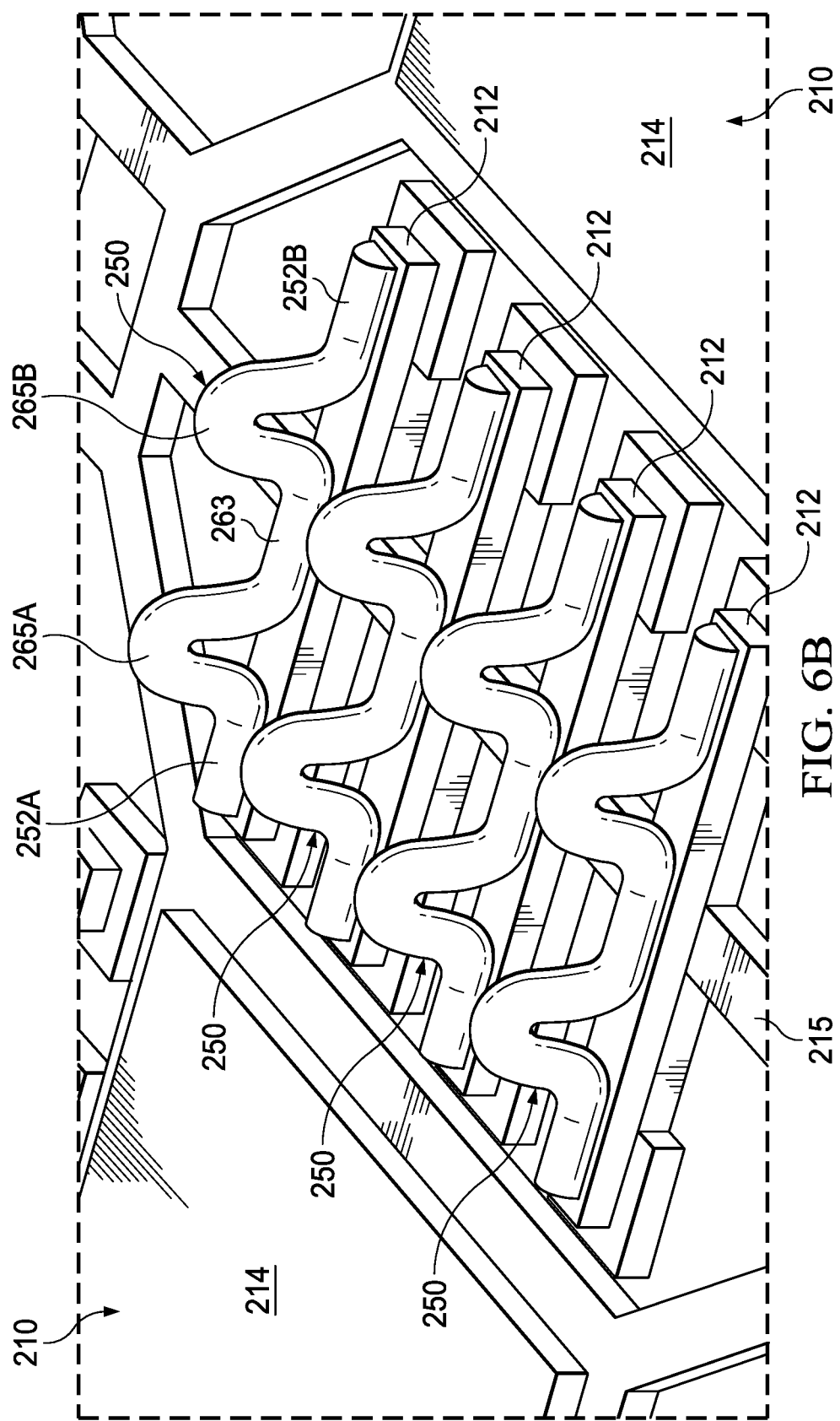
Figure 7:
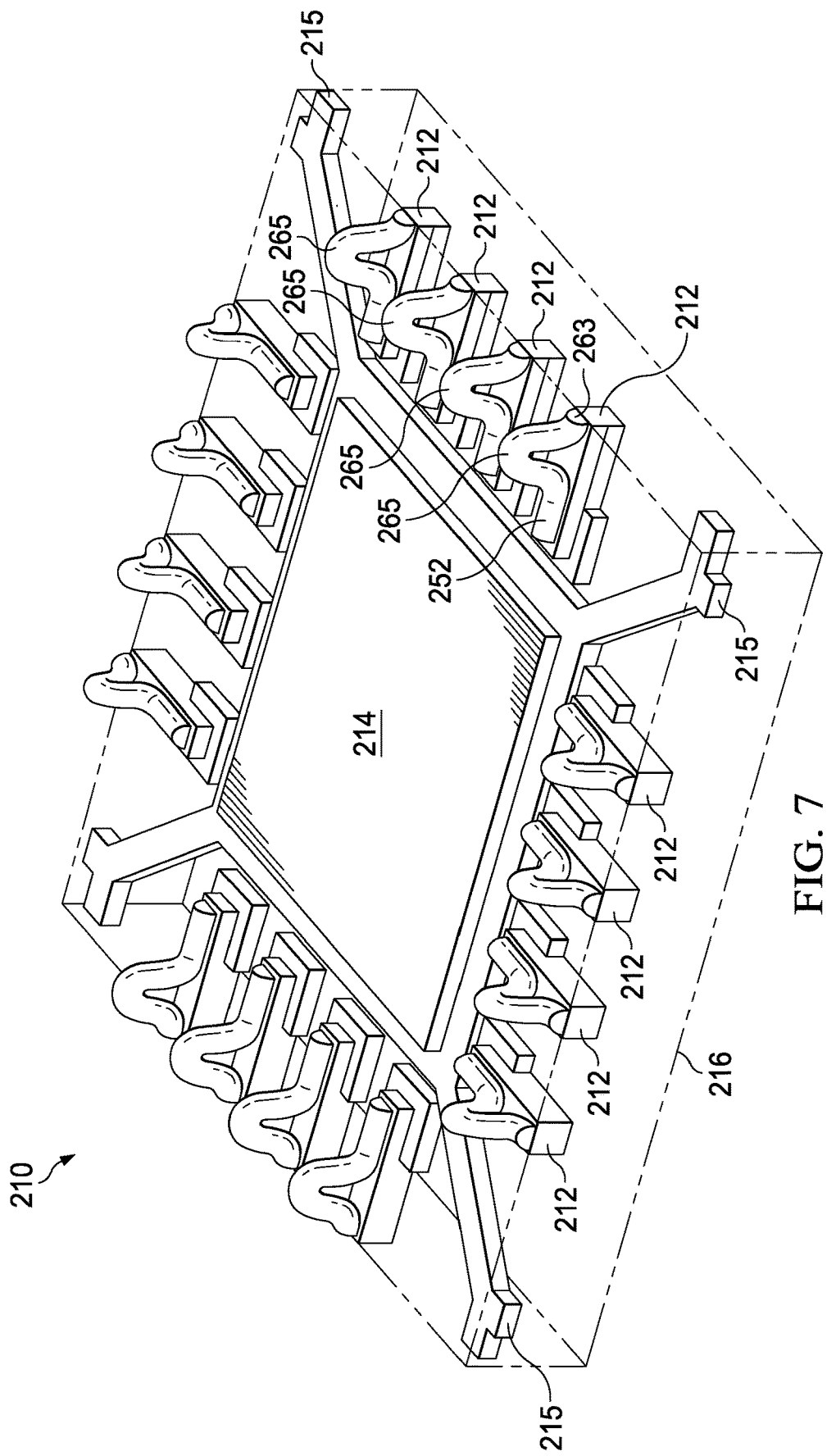
FIG. 7 is a perspective view of a QFN device of the strip assembly of FIGS. 6A and 6B after singulation.

FIGS. 6A, 6B and 7 illustrate example QFN packages 210 including wires extending from bottom surface of the QFN surface contacts 212. Specifically, FIG. 6A is a perspective view of multiple packages 210 on a strip assembly 200 subsequent to block molding but prior to singulation. FIG. 6B is a close-up perspective view of a portion of strip assembly 200. FIG. 7 is a perspective view of a single package 210 after singulation from strip assembly 200. packages 210 are the same as QFN packages 110, except that wires 150 with floating distal ends 164 have been replaced with wires 250, which are secured to contacts 212 on both ends. For brevity, details of QFN packages 110 are not discussed with respect to packages 210, although those details are equally applicable to packages 210.

Each package 210 includes at least one electronic component, which may be mounted to pad 214 and covered by mold compound 216. The electronic component is also electrically connected to at least some of the surface contacts 212.

Wires 250 extend from the exposed bottom surfaces of some or all of surface contacts 212. Although strip assembly 200 may include wires 250 for each surface contacts 212, some of wires 250 are omitted from FIG. 6A for simplicity. Wires 250 provide a solderable surface for mounting the packages 210 at a standoff on an external board, such as a PWB. The wires extend beyond a bottom surface of the mold compound in planar alignment to provide the standoff. While any standoff may be selected according to the requirements of a particular application, in some examples, a standoff between 100 to 600 microns is suitable to facilitate inspectable solder joints and reducing solder fatigue compared to standard QFN devices.

Wires 250 may be formed on one or more contacts 212 of packages 210 using a wire bonder, for example. The consistency of the heights, the standoff, of arches 265A, 265B (collectively, "arches 265") of wires 250 is uniform to support surface mounting package 210 by way of solder connections between arches 265 and electrical contacts of a board, such as a PWB. As best shown in FIG. 6B, each stitch bond 263 secures the wires 250 for two packages 210. During singulation, stitch bonds 263 are cut, with a portion of each stitch bonds 263 remaining on each singulated package 210. As wires 250 are cut in unison with mold compound 216 during singulation, the distal end of each wire 250 at stitch bond 263 is coplanar with a side surface of mold compound 216.

Following singulation, each of wires 250 is attached at both ends to an associated surface contact 212 with an arch 265 of the wire 250 providing the standoff for the associated surface contact 212. Specifically, each wire 250 is attached on both sides with stitch bonds 252, 263 to the associated surface contact 212 with an arch 265 between the two stitch bonds 252, 263.

For copper wire or other metal that would benefit from a plating layer, a tin coating may be applied to packages 210 either as part of strip assembly 200 or after singulation. Such a tin coating would also cover portions of surface contacts 212 exposed during the plating process.

Strip assembly 200 includes a leadframe strip 208, which includes a pad 214 and surface contacts 212 for each package 210. Leadframe strip 208 further includes tie bars 215 which interconnect pad 214, contacts 212 and other elements of the leadframes to one another as well as to elements of adjacent leadframes in a leadframe strip. Leadframe strip 208 is formed on a single thin (about 220 to 250 μm) sheet of metal by stamping or etching. Tie bars and siderails may be removed during singulation of packages 210 formed on leadframe strip 208.

Mold compound 216 provides a protective outer layer for the electronic component and electrical connections to contacts 212 in each package 210. Portions of contacts 212 and pad 214 are exposed an outer surface of each package 210.

Figure 8:
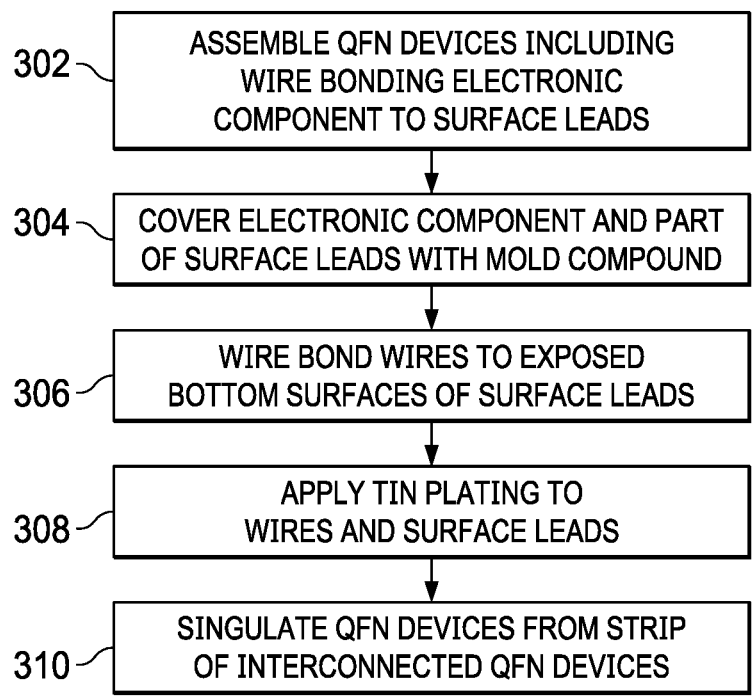
FIG. 8 is a flowchart of a method of fabricating a semiconductor package including wires extending from surface contacts of the package.

FIG. 8 is a flowchart of a method of fabricating a semiconductor package including wires extending from surface contacts of the package. For clarity, the method of FIG. 8 is described with reference to package 110 and FIGS. 4A, 4B and 5; however, the described techniques are not limited to the specific example of package 110, and may be adapted to other package designs, including package 210.

First, strip assembly 100, including a number of QFN packages 110, is assembled on a common leadframe strip 108. Each QFN device on the leadframe strip 108 includes an electronic component including terminals. The assembly process includes mounting the electronic component(s) for each package 110 to leadframe strip 108 and electrically connecting the terminals of the electronic component to at least some of the surface contacts 112 of the leadframe strip 108. For example, electrically connecting the terminals of the electronic component to at least some of the surface contacts 112 may include wire bonding (FIG. 8, step 302).

All of the QFN packages 110 of strip assembly 100 are bulk encapsulated with plastic mold compound 116, with only the bottom surface of each package 110 not being completely covered with the mold compound, leaving bottom surfaces of contacts 112 and pads 114 uncovered (FIG. 8, step 304). In this process, leadframe strip 108, with the attached electronic components of QFN packages 110, is placed in the cavity of a mold, such as a steel mold. A heated and viscous mold compound, such as an epoxy resin filled with inorganic granules, such as alumina and silicon dioxide, is pressured into the cavity to fill the cavity and surround the electronic components and leadframe strip 108 portions without voids. Mold compound 116 covers pad 114 and at least portions of contacts 112. Mold compound 116 may require an extended polymerization period ("curing"; commonly at 175° C. for 5 to 6 hours). After polymerizing the mold compound and cooling to ambient temperature, the mold is opened, while mold compound 116 remains adhered to the molded parts. Individual QFN packages 110 remain interconnected as part of strip assembly 100 after being covered with mold compound 116.

Following molding, QFN packages 110 may be tested for quality and functionality. In another example, the testing step occurs after placement of the wires 150.

The bulk molded QFN packages 110 may then be processed through a wire bonder step where a wire 150 is added to the exposed bottom surfaces of some or all of contacts 112 of each package 110 of strip assembly 100 (FIG. 8, step 306). Wires 150 have wire diameters of at least 200 microns, whereas wire bonds providing electrical connections between electronic component terminals and contacts 112, such as wire bonds 20 (FIG. 2) may have much smaller wire diameters, such as diameters less than 100 microns, such as diameters between about 10 to 50 microns. For this reason, a larger capillary may be used for forming wires 150 than used for forming wire bonds encapsulated within QFN packages 110.

In a wire bonding process, the wire is strung through the capillary of an automated bonder. The capillary tip is constructed by metal, such as steel or stainless steel. The automated bonder also includes cutter attached to cut the wire after making the bonding. For each of the wires 150, wire bonding includes attaching a first side of the wire to an associated one of surface contacts 112, forming an arch 154 extending beyond the exposed bottom surface of the surface contact 112, and attaching a second side of the wire to the associated surface contact 112 of the adjacent package 110. While either wire ribbons or circular wires can be used, as depicted, wires 150 are circular wires. A first stitch bond 152A is created by pressure between the capillary tip and the attachment area of contacts 112, often combined with transmitting ultrasonic energy, in order to attach the wire to the underlying metal of the surface contact 112. For examples with wire ribbons rather than circular wires, the stich bonds may be referred to as ribbon bonds. After the attachment, the capillary with wire is lifted in a controlled loop to span an arch 154 from stich bond 152A, to an attachment area of a contact 112 of an adjacent package 110. When the wire touches the attachment area surface, the capillary tip is pressed against the wire in order to flatten it and thus to form another stitch bond 152B. The capillary rises again and the cutter of the automated bonder severs the wire near the end of the second stitch bond 152B. In some examples, arches 154 may be ground simultaneously to ensure each of the wires 150 is in planar alignment to provide a standoff of the package 110.

The same techniques may be used to form stich bonds 252A, 263, 252B of strip assembly 200, although a third stitch bond is created before tearing such that each wire forms two arches 265A, 265B rather than a single arch 154. While either wire ribbons or circular wires can be used, as depicted, wires 250 are circular wires. For each of the wires 250, wire bonding includes attaching a first side of the wire to an associated one of surface contacts 212 with a stich bond 252A, forming an arch 265A extending beyond the exposed bottom surface of the surface contact 112, forming a second stich bond 263 spanning the surface contacts 112 of adjacent packages 210, forming a second arch 265B extending beyond the exposed bottom surface of the adjacent surface contact 112 of the adjacent package 110 and attaching a second side of the wire to the associated surface contact 112 of the adjacent package 110 with a third stitch bond 252B. In some examples, arches 265 may be ground simultaneously to ensure each of the wires 250 is in planar alignment to provide a standoff of the package 210. Loops 265A, 265B of packages 210 may improve dimensional stability compared to floating distal end 164 of QFN packages 110.

For copper wire or other metal that would benefit from a plating layer, a tin coating may be applied to QFN packages 110 either as part of strip assembly 100 or after singulation (FIG. 8, step 308). For example, the tin coating may be applied by electroplating. Coating the wires and the exposed bottom surfaces of the surface contacts with the tin coating covers the exposed portions of the surface contacts with the tin coating, but not portions of the surface contacts covered by the mold compound. The tin coating may inhibit oxidation of the underlying metal, and improve solderability of wires 150.

Following forming wires 150, package 110 is singulated from strip assembly 100 (FIG. 8, step 310). Singulation includes cutting leadframe strip 108, mold compound 116 and wires 150 to separate each package 110. During singulation of strip assembly 100, each wire 150 is cut through its arch 154 leaving a distal end 164 (FIG. 5) of each wire 150 free floating. Singulation of strip assembly 200 includes cutting through stich bond 263, leaving both ends of each wire 250 of each package 210 forming an arch 265 attached on both ends to a surface contact 212.

Following singulation, distal ends 164 may be bent into their final positions and/or ground simultaneously to provide a desired shape and/or ensure each of the wires 150 is in planar alignment to provide the standoff for the package. For example, while wires 150 with distal ends 164 are depicted as J-shaped leads, wires 150 may be bent into any desired final shape including, but not limited to S-shaped leads, and C-shaped leads. Likewise, arches 265 may be bent into their final positions and/or ground simultaneously to provide a desired shape. Bending may also ensure each of the wires 150, 250 is in planar alignment to provide the standoff for its package.

The specific techniques for semiconductor packages including wires extending from surface contacts of the package, such as described with respect to packages 110, 210 are merely illustrative of the general inventive concepts included in this disclosure as defined by the following claims. For example, while the disclosed examples refer to QFN devices with semiconductor dies, the disclosed techniques may be applied to any electronic package with a surface contact, including package configurations other the QFN, and/or electronic packages with any combination of active and passive components on a leadframe instead of or in addition to a semiconductor die.

What is claimed is:
1. An electronic package comprising:
   an electronic component including terminals;
   a plurality of surface contacts, at least some of the surface contacts being electrically coupled to the terminals within the electronic package;

a mold compound covering the electronic component and partially covering the surface contacts with a bottom surface exposed from the mold compound; and a plurality of wires extending from exposed surfaces of the surface contacts, each of the wires providing a solderable surface for mounting the electronic package at a standoff on an external board.

2. The electronic package of claim 1, further comprising wire bonds electrically coupling the terminals of the electronic component to the surface contacts, the mold compound covering the wire bonds.

3. The electronic package of claim 1, wherein each of the wires is attached on one side to an associated one of the surface contacts with a distal end of the wire free floating.

4. The electronic package of claim 3, wherein each of the wires is attached on the one side with a stitch bond to the associated surface contact.

5. The electronic package of claim 3, wherein each of the wires is bent to form one of a group consisting of:
   a J-shaped lead;
   an S-shaped lead; and
   a C-shaped leads.

6. The electronic package of claim 1, wherein each of the wires is attached at both ends to an associated one of the surface contacts with an arch of the wire providing the standoff for the associated surface contact.

7. The electronic package of claim 5, wherein each of the wires is attached on both sides with stitch bonds to the associated surface contact.

8. The electronic package of claim 1, wherein an end of each of the wires is coplanar with a side surface of the mold compound.

9. The electronic package of claim 1, wherein the standoff is in a range of 100 to 600 microns.

10. The electronic package of claim 1, wherein the wires extend beyond a bottom surface of the mold compound in planar alignment to provide the standoff.

11. The electronic package of claim 1, wherein the wires have wire diameters of at least 200 microns.

12. The electronic package of claim 1, wherein the wires are formed from copper or copper alloy.

13. The electronic package of claim 11, wherein the surface contacts are formed from copper or copper alloy.

14. The electronic package of claim 1, further comprising a tin coating covering the wires.

15. The electronic package of claim 14, wherein the tin coating covers exposed portions of the surface contacts, but not portions of the surface contacts covered by the mold compound.

16. The electronic package of claim 1, wherein the electronic component includes a semiconductor die.

17. The electronic package of claim 1, wherein the wires include one or more of a group consisting of:
   circular wires; and
   wire ribbons.

* * * * *